United States Patent
Womack (10) Patent No.: US 7,193,881 B2
(45) Date of Patent: Mar. 20, 2007

(54) CROSS-POINT FERROELECTRIC MEMORY THAT REDUCES THE EFFECTS OF BIT LINE TO WORD LINE SHORTS

(75) Inventor: Richard Hiram Womack, Albuquerque, NM (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/884,762

(22) Filed: Jul. 1, 2004

(65) Prior Publication Data

US 2006/0002178 A1     Jan. 5, 2006

(51) Int. Cl.
*G11C 11/22*    (2006.01)
(52) U.S. Cl. ....................... 365/145; 365/200
(58) Field of Classification Search ............ 365/185.09
See application file for complete search history.

(56) References Cited

U.S. PATENT DOCUMENTS

| | | | | |
|---|---|---|---|---|
| 4,161,038 A | * | 7/1979 | Wu ............................ | 365/145 |
| 4,660,179 A | * | 4/1987 | Aoyama ..................... | 365/200 |
| 4,688,220 A | * | 8/1987 | Pelgrom ..................... | 714/710 |
| 5,086,412 A | * | 2/1992 | Jaffe et al. .................. | 365/145 |
| 5,255,227 A | * | 10/1993 | Haeffele .................... | 365/200 |
| 5,508,954 A | * | 4/1996 | Mihara et al. .............. | 365/145 |
| 5,666,305 A | | 9/1997 | Mihara et al. | |
| 6,144,591 A | * | 11/2000 | Vlasenko et al. ........... | 365/200 |
| 6,269,040 B1 | * | 7/2001 | Reohr et al. ................ | 365/210 |
| 6,442,063 B2 | * | 8/2002 | Hartmann ................... | 365/158 |
| 6,480,419 B2 | * | 11/2002 | Lee ........................ | 365/185.18 |
| 6,807,083 B2 | * | 10/2004 | Yamamura .................. | 365/145 |
| 2002/0003727 A1 | | 1/2002 | Hartmann | |

FOREIGN PATENT DOCUMENTS

WO     WO-03/001532 A2     1/2003

* cited by examiner

*Primary Examiner*—Tan T. Nguyen
(74) *Attorney, Agent, or Firm*—Birch, Stewart, Kolasch & Birch LLP (57) ABSTRACT

A memory constructed from a dielectric layer sandwiched between a plurality of word conductors and a plurality of bit line conductors is disclosed. The dielectric layer includes a layer of ferroelectric material, and has first and second surfaces. The word conductors are located on the first surface. Each word conductor is connected to a corresponding word line driving circuit. The bit line conductors are located on the second surface. Each bit line conductor is connected to a corresponding bit line driving circuit and a corresponding sense amplifier by one or more disconnect switches. A disconnect switch is set to an open state if the bit line conductor connected to that disconnect switch is shorted to one of the word conductors.

6 Claims, 7 Drawing Sheets

CROSS-POINT FERROELECTRIC MEMORY THAT REDUCES THE EFFECTS OF BIT LINE TO WORD LINE SHORTS

FIELD OF THE INVENTION

The present invention relates to a memory device, and more particularly, to memory devices based on ferroelectric materials.

BACKGROUND OF THE INVENTION

Non-volatile mass-storage memories are used for computer data and program storage, and for storage applications in consumer products such as digital cameras and audio-video playback and recording devices. These memories can be divided into two broad classes of memory, mechanically addressed memories and electrically addressed memories. Mechanically addressed memories include magnetic and optically based disk drives and tape drives.

The mechanically addressed memories are the least expensive data storage medium in terms of cost per bit of data stored. These devices store data by altering some surface property of a relatively inexpensive storage medium. For example, in optically-based disk drives, the data is organized into a number of concentric tracks on a rotating disk. The surface of the disk is coated with a material whose reflectivity is altered over very small spots that represent the bits of the data being stored. The data is read by measuring the amount of light reflected from each spot. In read/write disks, the data is written by exposing each spot to a laser having a sufficient intensity to alter the reflectivity of the disk coating. Magnetically-based disks operate in an analogous manner using a surface coating that can be magnetized in two different directions.

However, mechanically addressed memories have three drawbacks that limit the use of such memories. First, these memories have a significant delay between the time a request is made to access data on a device and the time the data delivery starts. For example, when a computer requests a data file from a disk drive, the computer must wait for the disk drive to position the read head over the track on which the data is stored and then must wait for the relevant part of the track to rotate to the position of the disk drive. These delays are typically a few milliseconds.

Second, mechanically addressed memories require a significant amount of electrical power. For example, disk drives must provide power for the motor that rotates the disk and power for the actuator that moves the read head with respect to the disk surface. In addition, these drives must provide power for the read/write heads. The high power requirements of such disks cause problems when such memories are incorporated in devices that are battery powered such as digital cameras and laptop computers.

Third, inexpensive mechanically addressed memories are relatively large devices. For example, inexpensive disk drives are much larger than many digital cameras, and hence, cannot be used to store data for such applications without substantially increasing the size of the device. While miniaturized disk drives have been made for such applications, the cost of such miniaturized disk drives is much greater, and hence, limits their usefulness.

Electrically addressed mass storage media overcome, or greatly reduce, the above-described problems. However, the cost of the currently available memories of this type is more than a factor of a hundred more than the cost of storage using mechanically addressed devices. Electrically addressed storage devices such as those used for data storage on digital cameras, are constructed from arrays of semiconductor based storage cells that are organized in a manner similar to that used in computer memories. When a file stored in the memory is to be accessed, the appropriate memory cells are read or written by translating an address to determine a bus line that is powered within the memory. Hence, the delays inherent in the mechanically addressed memories are avoided. In addition, these memories do not require the mechanical components for spinning a disk or moving a read head with respect to the spinning disk, and hence, the size and power requirements are also substantially reduced.

Each storage cell typically has a storage element and an isolation transistor that is used to connect that storage element to a bus for reading and writing the storage element. The storage element, unlike the elements used in computer mass memories, retains the data stored therein when power is turned off. Since each storage cell requires a transistor, the device must be constructed on a silicon wafer in which the isolation transistor is located. Hence, the size of each bit is at least the size of the transistor and, hence, the "storage medium" is semiconductor quality crystalline silicon, which is much more expensive that the storage medium used in mechanically addressed memories.

Furthermore, the currently available electrically addressable memories use storage elements that are also transistors, and hence, the size of each bit is the size of at least two transistors. Accordingly, the size of the storage element is significantly greater than the "spots" on the disks discussed above. This further increases the cost per bit stored.

One type of electrically addressable memory that holds the promise of providing low cost storage utilizes a cross-point array of ferroelectric capacitors to store the data. Each capacitor has a slab of ferroelectric dielectric sandwiched between top and bottom electrodes. The dielectric can be polarized by applying a voltage across the electrodes. When the voltage is removed, the dielectric remains polarized. The direction of polarization is used to store a bit of data, a logical one corresponding to one direction of polarization and a logical zero corresponding to the other direction of polarization. The direction of polarization is set by the relative potentials of the electrodes with respect to one another when the voltage is applied.

The storage cells are typically organized into rectangular arrays having a number of rows and columns. All of the storage cells in a given column are connected to a bus, referred to as a "bit line". All of the storage cells in each row are connected to a bus, referred to as a "word line". Data is read and written via the bit lines into storage cells that are identified by potentials on the word lines.

The storage array can be constructed by depositing the conductors that are to become the bit lines on a substrate, depositing a dielectric layer of ferroelectric material over the bit lines, and then depositing the conductors that are to become the word lines over the dielectric layer. The individual capacitors correspond to areas in which the word lines cross the bit lines.

It should be noted that each capacitor does not require an isolation transistor, and hence, the size of a storage cell is determined by the minimum size of the capacitors. The minimum size of the capacitors is determined by the material constants of the dielectrics.

It should also be noted that the storage array does not need to be deposited on an expensive crystalline substrate having an area that is equivalent to that of the storage array. In addition, the storage arrays can be constructed on top of one another to provide stacked structures having very high densities of storage cells.

Data is read from the storage array by applying a potential across the relevant capacitors and observing the amount of charge that is released onto the bit lines. If the applied voltage causes the dielectric to be polarized in a direction opposite to the direction of polarization prior to applying the voltage, the capacitor will release a small charge pulse onto the bit line to which it is connected. If, however, the initial polarization of the dielectric is such that the polarization direction is not "flipped" by the voltage, a much smaller charge pulse will be released to the bit line. These charge pulses are sensed to determine the contents of the selected storage cells.

The minimum size of a storage cell is set by the ability of the read circuitry to differentiate the charge pulses corresponding to ones and zeros. The amount of charge released is, in turn, determined by the size of the capacitor and the material properties of the ferroelectric medium. For currently available ferroelectric materials, the amount of charge released is of the order of 20 fC from a capacitor having an area of 0.0625 $\mu m^2$.

Since the amount of charge that is to be sensed is very low, these memories are prone to failures that result from other sources of current on the bit lines during the read operation. For example, to provide realistic operating voltages, the thickness of the ferroelectric dielectric layer must be very small. This layer is typically 0.1 $\mu m$. Any current path through this layer at the points at which a word line crosses a bit line will result in current flowing from the word line to that bit line during the reading operation. Since the charge being sensed is so low, even very small pinpoint shorts can lead to an inoperative part. The present invention addresses the problems introduced by such shorts.

SUMMARY OF THE INVENTION

The present invention is a memory constructed from a dielectric layer sandwiched between a plurality of word conductors and a plurality of bit line conductors. The dielectric layer includes a layer of ferroelectric material, and has first and second surfaces. The word conductors are located on the first surface. Each word conductor is connected to a corresponding word line driving circuit. The bit line conductors are located on the second surface. Each bit line conductor crosses the word conductors. Each bit line conductor is connected to a corresponding bit line driving circuit and a corresponding sense amplifier by one or more disconnect switches. Each disconnect switch has an open state and a closed state, the disconnect switch disconnects the bit line from the driving circuit and/or the sense amplifier in the open state. A disconnect switch is set to an open state if the bit line conductor connected to that disconnect switch is shorted to one of the word conductors.

DETAILED DESCRIPTION OF THE PREFERRED EMBODIMENTS OF THE INVENTION

Figure 1:
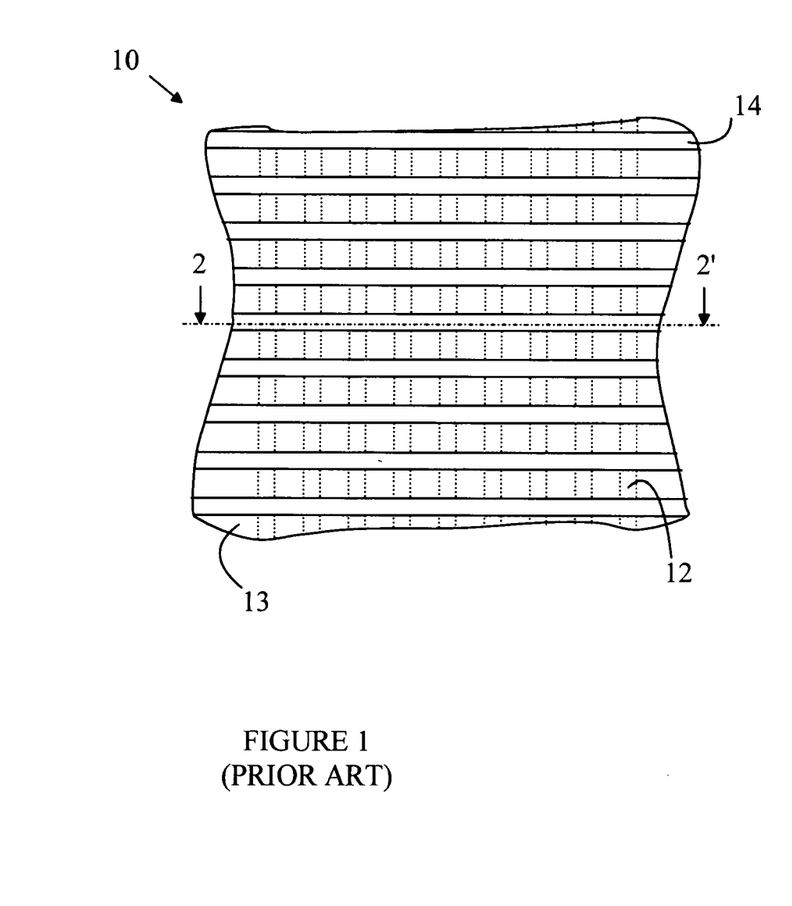
FIG. 1 is a top view of a portion of a ferroelectric cross-point array 10 having a plurality of ferroelectric capacitors organized as a rectangular array.
Figure 2:
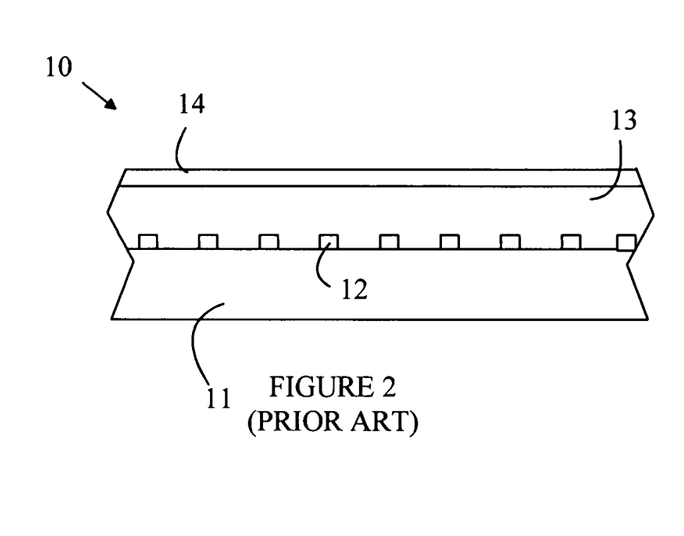
FIG. 2 is a cross-sectional view of array 10 through line 2–2'.

The manner in which the present invention provides its advantages can be more easily understood with reference to FIGS. 1–2. FIG. 1 is a top view of a portion of a ferroelectric cross-point array 10 having a plurality of ferroelectric capacitors organized as a rectangular array. FIG. 2 is a cross-sectional view of array 10 through line 2–2'. Array 10 includes three layers that are constructed on a substrate 11. The first layer includes a number of conductors 12 that are fabricated by depositing a metallic layer and then patterning the layer using conventional photo-lithographic techniques. These conductors form either the bit lines or word lines of a memory. In addition, these conductors form the bottom electrodes of the ferroelectric capacitors.

The second layer 13 includes a ferroelectric material that forms the dielectric layer of the capacitors. The layer is preferably an organic ferroelectric material. The thickness of this layer is typically 0.1 $\mu m$.

Finally, the third layer is deposited and patterned on top of the ferroelectric material. The third layer includes a number of parallel conductors 14 that run at right angles to conductors 12. These conductors form the other of the word lines or bit lines. These conductors also form the top electrodes of the ferroelectric capacitors. One such capacitor is formed at the point at which a conductor 12 crosses a conductor 14.

Figure 3:
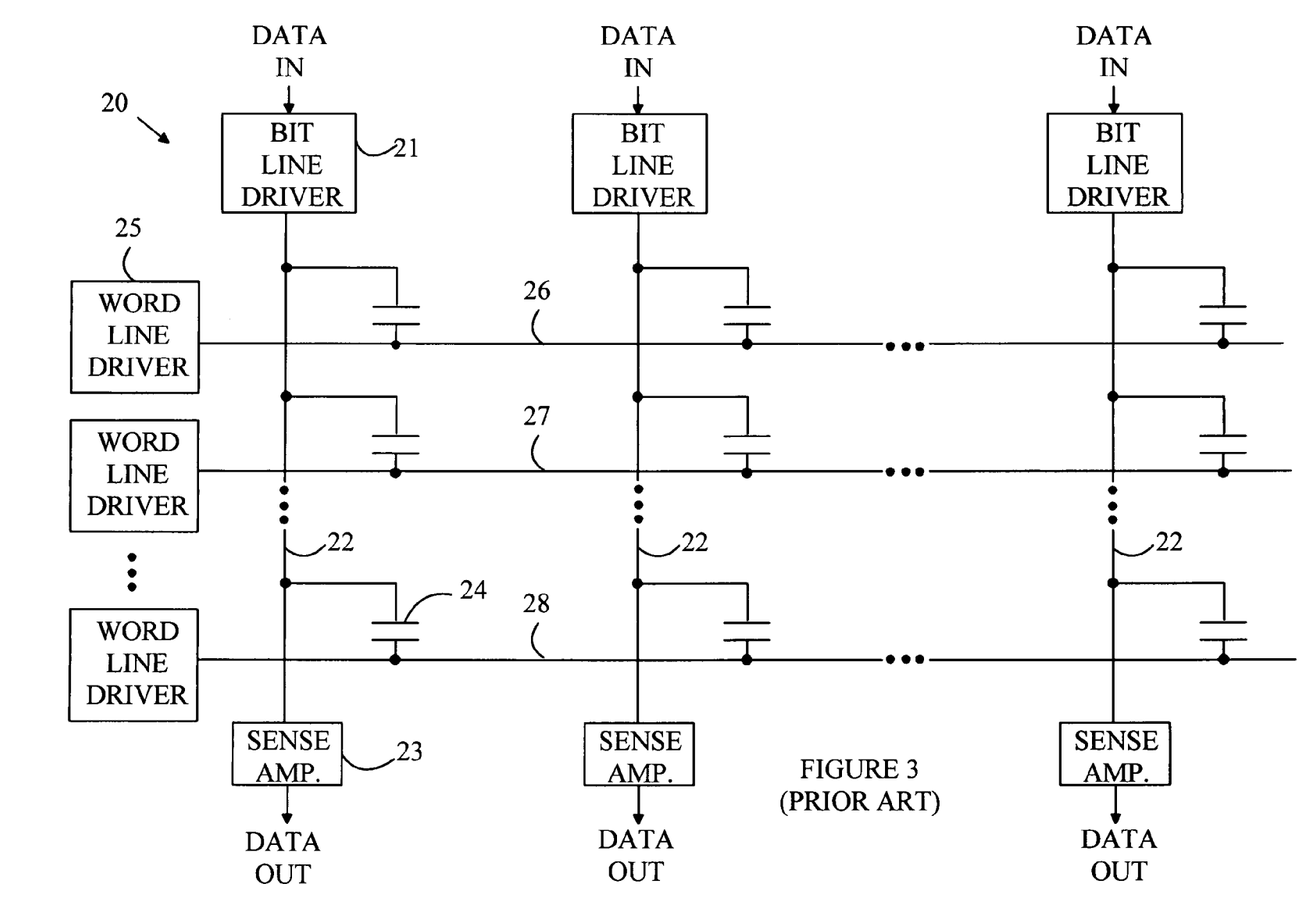
FIG. 3 is the equivalent circuit for a ferroelectric cross-point array memory.

Refer now to FIG. 3, which is the equivalent circuit for a ferroelectric cross-point array memory 20. Memory 20 includes a plurality of ferroelectric capacitors 24 organized as a plurality of rows of capacitors. All of the capacitors in a given row are connected to a word line corresponding to that row. Exemplary word lines are shown at 26–28. Each word line is connected to a word line drive circuit 25 that provides the signals used to read and write data into the capacitors attached to that word line.

Each capacitor also belongs to a column and is connected to a bit line corresponding to that column. Exemplary bit lines are shown at 22. Each bit line is connected to a sense amplifier 23 that senses the data stored in a capacitor that is connected to that bit line. In addition, each bit line is connected to a bit line driver 21 that is used to control the voltages on the bit line during read and write operations. The pattern of voltages that are applied to the bit and word lines during read and write operations will be discussed in more detail below.

As noted above, the ferroelectric dielectric in each of the capacitors can be polarized by applying a voltage between the top and bottom electrodes of the capacitor to create an electric field in the dielectric. If a sufficiently large field is created in the ferroelectric material, the material will retain a residual polarization after the external electric field is removed. To balance the electric field associated with this residual polarization, electrons are removed from one electrode of the capacitor and accumulate on the other electrode until the net voltage across the capacitor is zero. If the direction of the polarization is reversed by applying an electric field in the opposite direction, the electrons that had accumulated on that electrode must now flow to the opposite electrode to cancel the electric field associated with the new direction of polarization.

This effect can be used to sense the direction of polarization of the dielectric in the capacitor by measuring the current that flows in the bit line when a voltage is applied across the electrodes of a capacitor by applying appropriate signals to the bit line and word line defining that capacitor. If the original polarization is in the opposite direction to that created by the applied voltage, the polarization will "flip" and charge will flow on the bit line. If the original polarization was in the same direction as the electric field generated by the applied voltage, the polarization will not flip, and, in principle, no net current will be accumulated on the bit line. In practice, a current that is much smaller than that associated with a flip will be observed in this later case.

Figure 4:
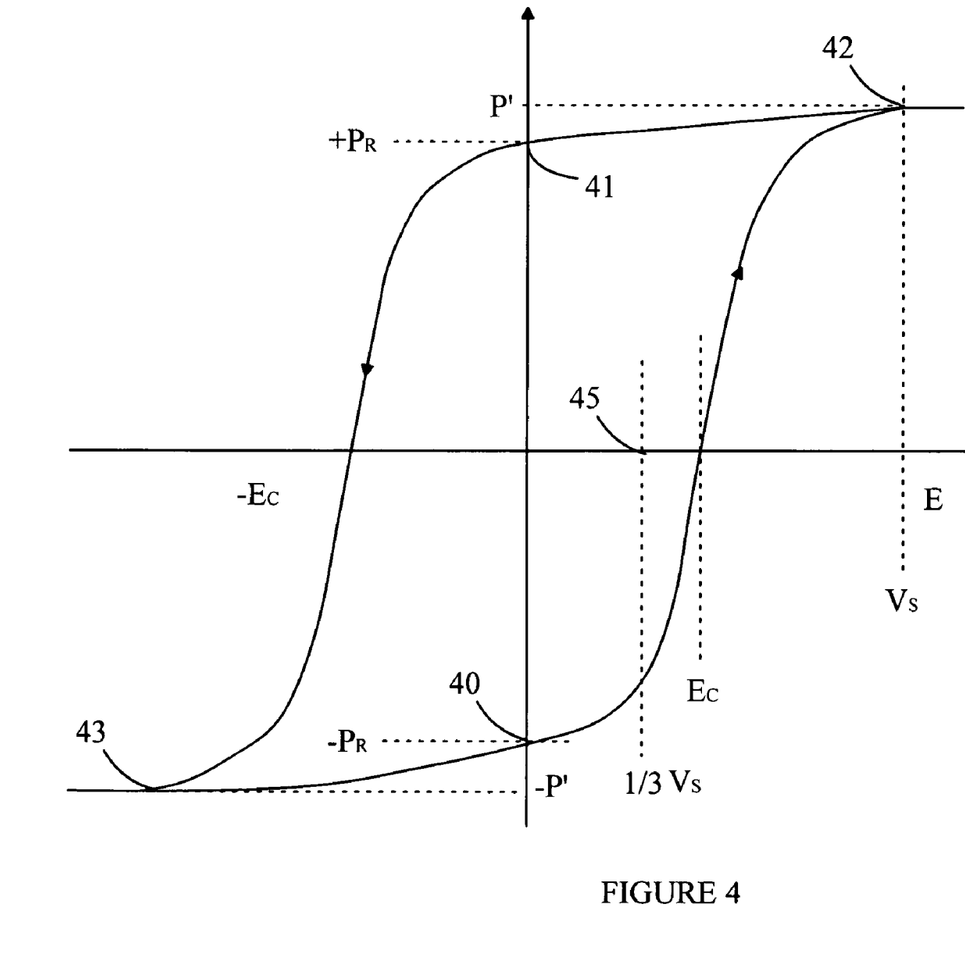
FIG. 4 illustrates the relationship between the applied electric field and the polarization in one of the capacitors.

Refer now to FIG. 4, which illustrates the relationship between the applied electric field and the polarization in one of the capacitors. The polarization executes a hysteresis loop when the applied field is switched back and forth between a field corresponding to a potential difference of Vs and a field corresponding to a potential difference –Vs across the electrodes. Assume that the polarization is initially –Pr and the applied voltage is zero as shown at 40. If a potential of Vs is now applied to the electrodes, the polarization will change to P' as shown at 42. The field generated by this potential has a magnitude that is proportional to Vs/d where d is the thickness of the ferroelectric dielectric. When the potential is removed, the polarization will settle at +Pr as shown at 41. If a potential difference of Vs is again applied to the capacitor, the polarization will again move to P'. When the voltage is removed, the polarization will again return to point 41. Accordingly, by applying Vs to a capacitor that is already polarized in the direction of the applied field, the polarization does not change, and hence, the net charge stored on the capacitor will remain the same. That is, no net current will flow between the electrodes of the capacitor.

If, on the other hand, a potential of –Vs is applied to the electrodes, the capacitor will move to the state shown at 43, and the polarization will flip. When the potential is removed, the polarization will again be –Pr as shown at 40. In this case, a net charge flows between the plates of the capacitor via the external circuitry.

In a read operation, all of the capacitors on a given row are subjected to the same potential while the capacitors on the other rows are held at potentials that assure that the potential across those capacitors is zero. For example, the word line on the row to be read is switched to Vs while the bit lines are held at zero. The capacitors on that row will all be subjected to a potential difference of Vs. The other word lines are held at zero, and hence, the capacitors on those rows will not be subjected to any potential difference, and the data stored in those capacitors will remain unchanged.

It should be noted that this read operation is destructive, and hence, the data in the row that was read must be rewritten. If new data is to be written to the capacitors in a row, the row is first read and the new data is written in place of the old data that was read out.

At the start of a write, all of the capacitors in the row are in the same state. The new data is placed on the bit lines. Hence, some of the bit lines will be at different potentials then others of the bit lines. If there were only one row in the memory, this would not cause a problem. However, these bit lines are also connected to capacitors in rows that are not being written, and hence, some of these capacitors will be subjected to potential differences across some of their electrodes that could alter the data stored in those capacitors.

The key to selectively writing only one row is to choose the word line voltages during a write operation such that the potentials applied to the capacitors in the non-selected rows are not sufficient to cause the data stored in these capacitors to be altered. The write strategy is based on the observation that the non-selected capacitors can be subjected to a small potential difference without flipping the polarization of the dielectrics. This potential is shown at 45 in FIG. 4. For the materials discussed above, this potential is Vs/3. If, however, the capacitor is subjected to a potential such that the internal field is greater than Ec, the polarization will flip.

Figure 5:
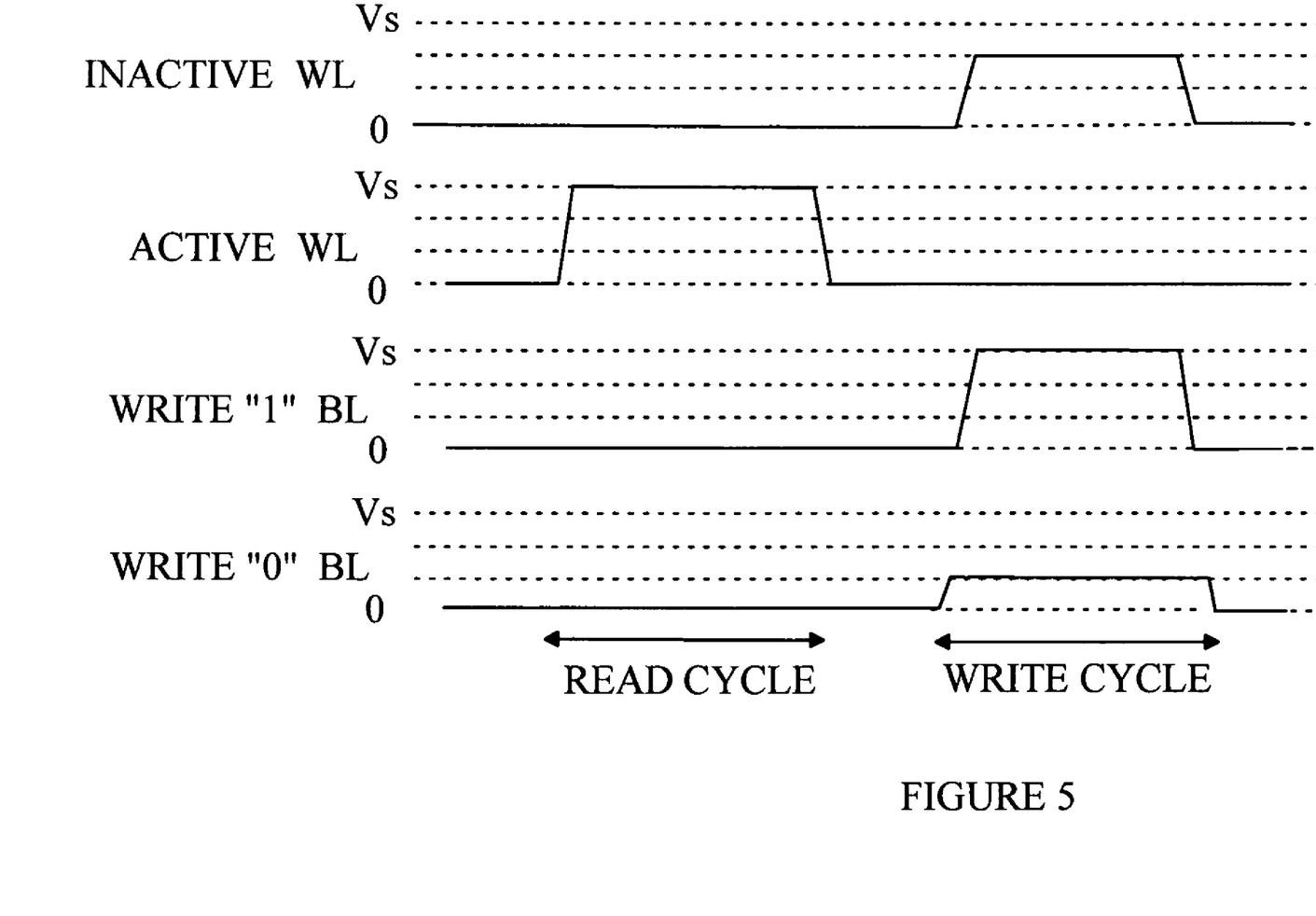
FIG. 5 illustrates the voltage patterns utilized for the word lines and bit lines in one embodiment of the present invention.

The voltage patterns utilized for the word lines and bit lines in one embodiment of the present invention are shown in FIG. 5. During the write portion of the cycle, the word lines corresponding to the non-selected rows are held at 2/3 Vs. A one is written by a potential of Vs on the bit line, and a zero is written by a potential of Vs/3 on the bit line. Hence, the potential difference across a non-selected capacitor is always Vs/3, and the capacitor's polarization remains in the same direction. The bit line corresponding to the row being written is held at ground during the write operation. All of the capacitors store a logical 0 at the start of the write operation. Hence, capacitors on a bit line with a potential corresponding to a 0 are subjected to a potential difference of Vs/3, and the polarization in these capacitors will not flip. Capacitors on a bit line with a potential corresponding to a 1 will, on the other hand, be subjected to a potential difference of Vs, and the polarization in these capacitors will flip.

The above-described memories have significant problems if a bit line is shorted to a word line. Such shorts are much more common in practical implementations of cross-point capacitor arrays such as those described above than in conventional memories. It is advantageous to utilize a design in which Vs is as small as possible, since the drivers, sense amplifiers, and other logic circuitry are preferably constructed on conventional silicon wafers using conventional semiconductor elements. If Vs is large, high voltage power supplies must be provided to convert the conventional voltage levels to these high levels. In addition, the cost of isolating the conductors carrying these high voltages from the remainder of the circuitry is significant. The required electric field is set by the properties of the ferroelectric dielectric material, and hence cannot be reduced. The electric field generated in the dielectric by placing a potential difference of Vs across the dielectric is proportional to Vs/d, where d is the thickness of the dielectric layer between the word and bit lines. Hence, if Vs is to be minimized, d must be made as small as possible. However, very thin layers of dielectric are prone to defects that short the word line and bit line in the region in which these conductors cross.

Figure 6:
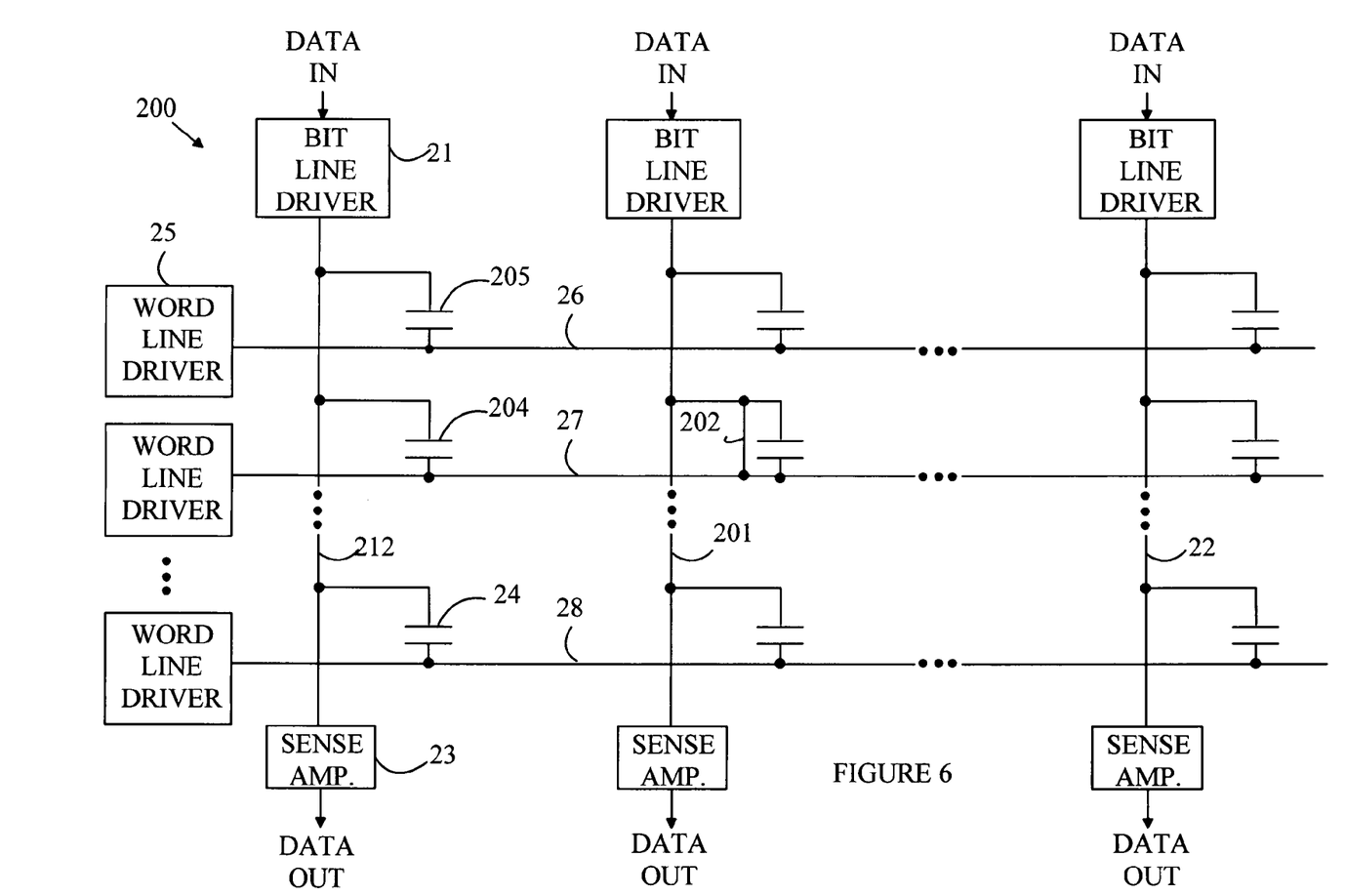
FIG. 6 illustrates a memory according to one embodiment of the present invention.

Refer now to FIG. 6, which illustrates a memory 200 according to one embodiment of the present invention. To simplify the drawing, the elements of memory 200 that serve the same functions as elements shown in FIG. 3 have been given the same numeric designations as in FIG. 3, and will not be discussed in detail here. The short in question is shown at 202. This short connects bit line 201 to word line 27.

A short such as that shown at 202 can give rise to a number of problems. First, a number of storage cells become unusable. In particular, the storage cells connected to bit line 201 and the storage cells connected to word line 27 such as storage cell 204 will not function properly in prior art devices in which such a short is present. In particular, a write operation requires that the bit line and word line execute the pattern of voltage transitions discussed above. It should be noted that these patterns require the bit line to be at different voltages than the word line. However, if the two lines are shorted, the actual voltages on the lines will depend on the relative current driving capability of the bit line and word line drivers and on the impedance of the short.

If the short has very low impedance, the potentials of the power supplies connected to these drivers may be altered, and thus the entire memory can be rendered inoperative. In this regard, it should be noted that even with very thin ferroelectric layers, the potentials needed to read and write the memory are higher than the potentials provided to conventional CMOS circuitry, and hence, the ferroelectric memories typically include a power converter that has a limited current driving capability. The capacity of such a power converter can easily be overcome by such a short.

Finally, it should be noted that the voltage pattern used to write a word includes a first pattern that is applied to the word being written and a second pattern that is applied to other words to prevent the contents of those words from being altered during the write operation. Since the shorted word line cannot execute the correct voltage pattern, the contents of that word line will be altered during writes to other word lines. Each time a memory cell's contents are changed, charge flows into or out of the ferroelectric capacitor via the bit line to which it is connected. Hence, even if the memory cells on the shorted bit line are not used to store data, these memory cells act as noise sources that can alter the operation of the good memory cells on the other bit lines such as memory cell 205 on bit line 212.

Figure 7:
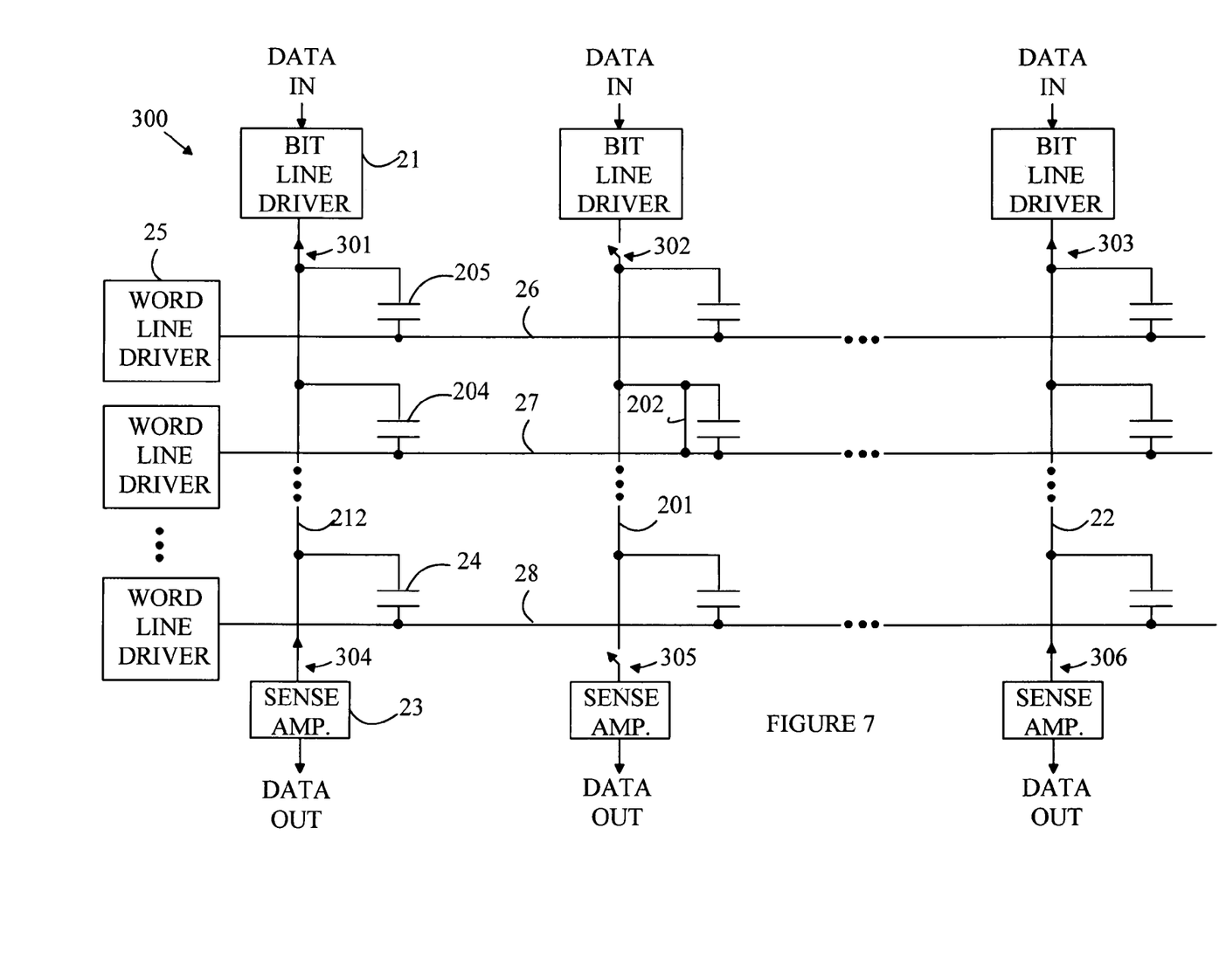
FIG. 7 is a schematic drawing of a memory according to another embodiment of the present invention.

The present invention overcomes these problems in a manner that not only prevents the noise signals and power supply problems discussed above, but also salvages the capacitors in the columns that are not connected to the shorted bit line. Refer now to FIG. 7, which is a schematic drawing of a memory 300 according to one embodiment of the present invention. To simplify the following discussion, those elements of memory 300 that serve functions analogous to elements discussed above with reference to FIG. 6 have been given the same numeric designations and will not be discussed further here.

Memory 300 includes switches that allow each of the bit lines to be isolated from the sense amplifiers and bit line drivers. Exemplary switches are shown at 301–306 in the drawing. When the switches associated with a particular bit line are opened, that bit line will float unless it is shorted to a word line. Consider bit line 201, which is shorted to word line 27. If switches 302 and 305 are opened, bit line 201 will behave as if that bit line is part of word line 27. Hence, word line 27 will behave as a normal word line with some additional capacitance. As a result, word line 27 can execute the voltage pattern of a write operation even though it is shorted to bit line 201.

Furthermore, the memory cells on word line 27 that are not connected to bit line 201 can be read and written as if the short does not exist. Hence, these memory cells can be utilized. Accordingly, only one column of memory cells is lost.

Figure 8:
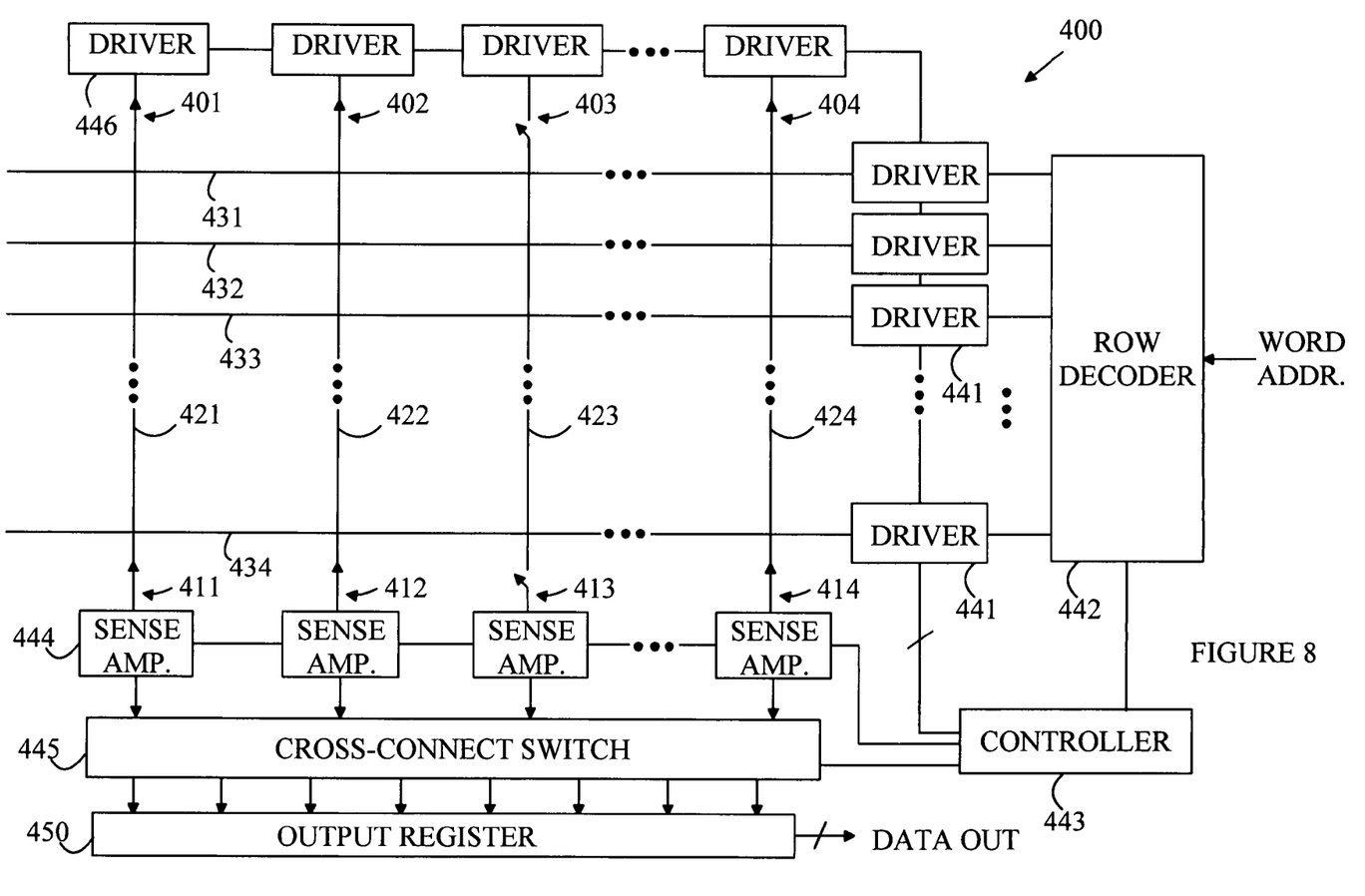
FIG. 8 illustrates a memory according to another embodiment of the present invention that includes circuitry for replacing a row or column of memory cells.

Refer now to FIG. 8, which illustrates a memory according to one embodiment of the present invention that includes circuitry for replacing a row or column of memory cells. Memory 400 includes an array of ferroelectric capacitors formed at the overlap regions of a plurality of bit lines and word lines. To simplify the drawing, the capacitors have been omitted. Exemplary word lines are shown at 431–434, and exemplary bit lines are shown at 421–424. Each bit line is connected to a bit line driver 446 and a sense amplifier 444. Each word line includes a driver 441 that sets the voltage pattern on that word line during read and write operations depending on whether that word line is active or not.

Each bit line also includes isolation switches for disconnecting that bit line from the sense amplifier and driver corresponding to that bit line. The isolation switches corresponding to bit lines 421–424 that disconnect those bit lines from the bit line drivers are shown at 401–404, respectively. Similarly, the isolation switches corresponding to bit lines 421–424 that disconnect those bit lines from the sense amplifiers are shown at 411–414, respectively.

The state of the isolation switches can be set by a controller 443 that is part of memory 400 or by some external device at the time the memory is tested. For example, the isolation switches can be implemented as links that are broken by exposure to a laser. In another embodiment, the switches are controlled by a register having a non-volatile memory in which the status of each switch is stored at the time the memory is tested.

Memory 400 includes a number of spare rows and columns. Denote the number of word lines in memory 400 by Nw and the number of bit lines by Nb. A word is accessed by transmitting a word address to a row decoder 442. To simplify the discussion, it will be assumed that the address is a binary number having a fixed number of bits. Hence, the number of addressable word lines is log(A+1), where A is the largest possible address. Nw is chosen to be greater than the number of addressable word lines. Row decoder 442 includes a mapping that associates one word line with each possible address. The additional word lines are used as spares. Row decoder 442 is programmed with a default mapping that defines which word lines are spares and which word lines are mapped to word addresses. If a word line that would normally be mapped to an address is defective, the mapping in row decoder 442 is altered such that the address in question is mapped to one of the spare word lines. The changes in the maps are typically made at the time the memory is tested either via the tester or controller 443.

Since the present invention can salvage word lines that are defective because that word line is shorted to a bit line, the number of spares needed is considerably less than in a memory that does not employ the isolation switches of the present invention. However, some word lines may have other defects that prevent those word lines from being salvaged. Hence, some spare rows are provided in this embodiment of the present invention.

Similarly Nb is greater that the number of bits in a word. The additional bit lines correspond to spare columns of memory cells. A cross-connect switch 445 maps the Nb bit lines to the N output bits that are stored in an output register 450 in the embodiment shown in FIG. 8. The map is programmed to a default map during manufacturer. If a bit line that would normally be mapped to a bit in a word is found to be defective when the memory is tested, the mapping in cross-connect switch 445 is altered such that the defective column is replaced by one of the spare bit lines. The relevant map changes can be entered at the time memory 400 is tested either by controller 443 or by directly altering the map using the test device.

The above-described embodiments of the present invention utilized an arrangement in which the bit line driving circuit is separated from the sense amplifier, and hence, two disconnect switches are required to isolate a bit line that is shorted to a word line. It should be noted, however, that embodiments in which the bit line driving circuit is part of the sense amplifier can also be constructed. In this case, only one disconnect switch is needed per bit line.

The above-described embodiments refer to a "short" between a word line and a bit line. For the purposes of this discussion, a short is defined to be any conduction path between a word line and a bit line that allows a charge that is greater than a predetermined charge to be transferred from the word line to the bit line during a read or write operation. The predetermined charge is preferably one tenth of the charge generated on the bit line when the ferroelectric dielectric in one of the memory cells switches the direction of polarization of the dielectric.

The above-described embodiments utilize a cross-connect switch to select the bit lines that define the columns of memory cells that are used at any given time. However, any switching arrangement that allows a subset of the bit lines to be selected can be utilized.

In the above-described embodiments of the present invention, the bit line that is shorted to a word line is disconnected. This arrangement is preferred because it allows the remaining storage elements on the word line to be utilized while protecting the power supplies and allowing the correct voltages to be applied to the remainder of the array. However, embodiments in which the word line is disconnected by switches in the drivers associated with that line can also be advantageously utilized. For example, each of the drivers shown at 441 in FIG. 8 may include a disconnect switch for isolating the word line associated with that driver. In such an arrangement, the word line may be viewed as part of the bit line when the word line is disconnected. While the storage elements on the disconnected word line will no longer function, such an arrangement does protect the power supplies and allows the correct voltages to be applied to the remainder of the array.

Various modifications to the present invention will become apparent to those skilled in the art from the foregoing description and accompanying drawings. Accordingly, the present invention is to be limited solely by the scope of the following claims.

What is claimed is:

1. A memory comprising:
  a dielectric layer comprising a layer of ferroelectric material, said dielectric layer having first and second surfaces;
  a plurality of word conductors on said first surface, each word conductor being connected to a corresponding word line driving circuit; and
  a plurality of bit line conductors on said second surface, each bit line conductor crossing said word conductors, each bit line conductor being connected to a corresponding bit line driving circuit and a corresponding sense amplifier by one or more disconnect switches, each disconnect switch having an open state and a closed state, said disconnect switch disconnecting said bit line from said driving circuit and/or said sense amplifier in said open state;
  wherein one of said disconnect switches is set to an open state if said bit line conductor connected to that switch is shorted to one of said word conductors.

2. The memory of claim 1 further comprising a bit line selection circuit that selects a sub-set of said bit line conductors for connection to an output circuit, said selected bit line conductors being bit line conductors for which said disconnect switches are set to said closed state.

3. The memory of claim 2 wherein said selection circuit comprises a cross-connect switch.

4. A memory comprising:
  a dielectric layer comprising a layer of ferroelectric material, said dielectric layer having first and second surfaces;
  a plurality of word conductors on said first surface, each word conductor being connected to a corresponding word line driving circuit by a disconnect switch, each disconnect switch having an open state and a closed state, said disconnect switch disconnecting said word line from said driving circuit in said open state; and
  a plurality of bit line conductors on said second surface, each bit line conductor crossing said word conductors, each bit line conductor being connected to a corresponding bit line driving circuit and a corresponding sense amplifier;
  wherein one of said disconnect switches is set to an open state if said word line conductor connected to that switch is shorted to one of said bit line conductors.

5. A method for operating a memory comprising:
  a dielectric layer comprising a layer of ferroelectric material, said dielectric layer having first and second surfaces;
  a plurality of word conductors on said first surface, each word conductor being connected to a corresponding word line driving circuit; and
  a plurality of bit line conductors on said second surface, each bit line conductor crossing said word conductors, each bit line conductor being connected to a corresponding bit line driving circuit and a corresponding sense amplifier by one or more disconnect switches, each disconnect switch having an open state and a closed state, said disconnect switch disconnecting said bit line from said driving circuit and/or said sense amplifier in said open state,
  said method comprising:
  testing said memory to determine if any of said word conductors is shorted to any of said bit line conductors;
  setting said disconnect switches connected to one of said bit lines that is shorted to one of said word conductors to said open state; and
  setting said disconnect switches connected to one of said bit lines that is not shorted to any of said word conductors to said closed state.

6. A method for operating a memory comprising:
  a dielectric layer comprising a layer of ferroelectric material, said dielectric layer having first and second surfaces;
  a plurality of word conductors on said first surface, each word conductor being connected to a corresponding word line driving circuit; and
  a plurality of bit line conductors on said second surface, each bit line conductor crossing said word conductors, each bit line conductor being connected to a corresponding bit line driving circuit and a corresponding sense amplifier by one or more disconnect switches, each disconnect switch having an open state and a closed state, said disconnect switch disconnecting said bit line from said driving circuit and/or said sense amplifier in said open state,
  said method comprising:
  testing said memory to determine if any of said word conductors is shorted to any of said bit line conductors; and
  setting said disconnect switches connected to one of said word lines that is shorted to one of said bit line conductors to said open state.

* * * * *